(12) United States Patent
Yeh et al.

(10) Patent No.: US 12,131,772 B2
(45) Date of Patent: Oct. 29, 2024

(54) THREE DIMENSION MEMORY DEVICE CAPABLE OF IMPROVING SENSING ACCURACY IN HIGH-SPEED DATA SENSING OPERATION

(71) Applicant: MACRONIX International Co., Ltd., Hsinchu (TW)

(72) Inventors: Teng-Hao Yeh, Hsinchu County (TW); Hang-Ting Lue, Hsinchu (TW); Shang-Chi Yang, Changhua County (TW); Fu-Nian Liang, New Taipei (TW); Ken-Hui Chen, Taipei (TW); Chun-Hsiung Hung, Hsin-Chu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 186 days.

(21) Appl. No.: 17/751,445

(22) Filed: May 23, 2022

(65) Prior Publication Data
US 2023/0377633 A1 Nov. 23, 2023

(51) Int. Cl.
*G11C 16/00* (2006.01)
*G11C 5/06* (2006.01)
(Continued)

(52) U.S. Cl.
CPC .......... *G11C 11/4094* (2013.01); *G11C 5/063* (2013.01); *G11C 11/4072* (2013.01);
(Continued)

(58) Field of Classification Search
CPC ....... G11C 16/102; G11C 16/24; G11C 16/28; G11C 16/0408
See application file for complete search history.

(56) References Cited

U.S. PATENT DOCUMENTS 11,221,827 B1 * 1/2022 Hsu ..................... G06N 3/063
11,495,298 B1 * 11/2022 Hsu ..................... G11C 16/24
(Continued)

FOREIGN PATENT DOCUMENTS

| TW | 201214434 | 4/2012 |
| TW | 497496 | 8/2015 |

(Continued)

OTHER PUBLICATIONS

Hang-Ting et al. ("Introduction of 3D AND-type Flash Memory and It's Applications to Computing-in-Memory (CIM)", 2021, International Symposium of VLSI Technology, date added to IEEE Xplore May 28, 2021, 2021). (Year: 2021).*

(Continued)

*Primary Examiner* — Mushfique Siddique
(74) *Attorney, Agent, or Firm* — J.C. PATENTS

(57) ABSTRACT

A three dimension memory device, such as an AND-type memory, includes a memory cell tile, multiple source line switches, multiple first bit line switches to fourth bit line switches. The memory cell tile is divided into a first and a second memory cell sub-tiles. The first bit line switches are respectively coupled to multiple first bit lines of a first part of the first memory cell sub-tile. The second bit line switches are respectively coupled to multiple second bit lines of a second part of the first memory cell sub-tile. The third bit line switches are respectively coupled to multiple third bit lines of a first part of the second memory cell sub-tile. The fourth bit line switches are respectively coupled to multiple fourth bit lines of a second part of the second memory cell sub-tile.

21 Claims, 9 Drawing Sheets

(51) Int. Cl.
*G11C 11/4072* (2006.01)
*G11C 11/408* (2006.01)
*G11C 11/4091* (2006.01)
*G11C 11/4093* (2006.01)
*G11C 11/4094* (2006.01)
*G11C 11/4096* (2006.01)

(52) U.S. Cl.
CPC ...... *G11C 11/4085* (2013.01); *G11C 11/4091* (2013.01); *G11C 11/4093* (2013.01); *G11C 11/4096* (2013.01)

(56) References Cited

U.S. PATENT DOCUMENTS

| | | | | |
|---|---|---|---|---|
| 2013/0176781 | A1* | 7/2013 | Hung | G11C 16/04 365/185.05 |
| 2020/0243149 | A1* | 7/2020 | Hsu | G11C 16/30 |
| 2022/0139430 | A1* | 5/2022 | Chang | G11C 8/14 365/230.03 |
| 2022/0415398 | A1* | 12/2022 | Lien | G11C 16/08 |
| 2023/0007890 | A1* | 1/2023 | Yeh | G11C 11/4094 |
| 2023/0154545 | A1* | 5/2023 | Chen | G11C 16/26 365/185.29 |

FOREIGN PATENT DOCUMENTS

| | | |
|---|---|---|
| TW | I581370 | 5/2017 |
| TW | 603256 | 10/2017 |

OTHER PUBLICATIONS

"Office Action of Taiwan Counterpart Application", issued on Jun. 17, 2023, p. 1-p. 3.

* cited by examiner

THREE DIMENSION MEMORY DEVICE CAPABLE OF IMPROVING SENSING ACCURACY IN HIGH-SPEED DATA SENSING OPERATION

BACKGROUND

Technology Field

The disclosure relates to a three dimension memory device, and particularly, to a three dimension memory device capable of improving the accuracy of sensing results.

Description of Related Art

In memory devices, when a high-speed data sensing operation is performed, the bit line voltage cannot be quickly stabilized, so extra offset current often occurs in the sensing path of the sense amplifier. If the load of the bit line is charged when the memory cell is performing the sensing operation, the displacement current (similar to the read current of the memory cell) of up to several microamps may affect the accuracy of the sensing.

SUMMARY

The disclosure provides a three dimension memory device capable of improving the accuracy of data reading.

The three dimension memory device of the disclosure includes a memory cell tile, multiple source line switches, multiple first bit line switches, multiple second bit line switches, multiple third bit line switches, and multiple fourth bit line switches. The memory cell tile is divided into a first memory cell sub-tile and a second memory cell sub-tile. The first memory cell sub-tile includes multiple first memory cells, and the second memory cell sub-tile includes multiple second memory cells. Multiple source line switches are commonly coupled to a common source line and respectively coupled to multiple first source lines of the first memory cell sub-tile and multiple second source lines of the second memory cell sub-tile. First bit line switches are commonly coupled to a first global bit line and respectively coupled to multiple first bit lines in a first part of the first memory cell sub-tile. Second bit line switches are commonly coupled to a second global bit line and respectively coupled to multiple second bit lines in a second part of the first memory cell sub-tile. Third bit line switches are commonly coupled to the first global bit line and respectively coupled to multiple third bit lines in a first part of the second memory cell sub-tile. Fourth bit line switches are commonly coupled to the second global bit line and respectively coupled to multiple fourth bit lines in a second part of the second memory cell sub-tile.

In summary, in the three dimension memory device of the disclosure, the memory cell tile is divided into two memory cell sub-tiles. Through different bit line switches corresponding to the memory cell sub-tiles respectively, in the data read operation, the selected memory cells and the unselected memory cell sub-tiles provide reference memory cells to be coupled to the sense amplifier. Accordingly, the load balance on the two input terminals of the sense amplifier can be increased, and the accuracy of data reading can be improved.

DESCRIPTION OF THE EMBODIMENTS

Figure 1:
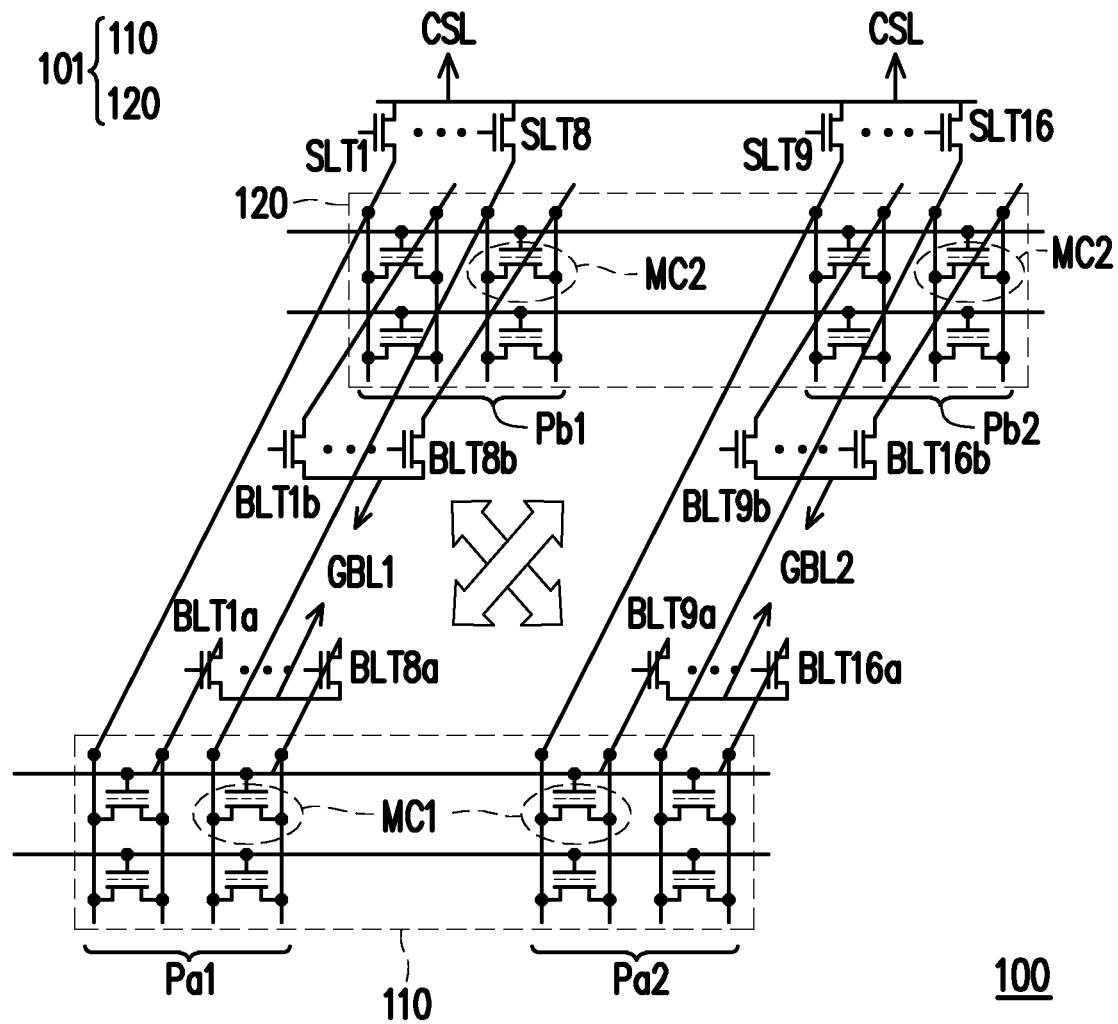
FIG. 1 is a schematic view of a three dimension memory device according to an embodiment of the disclosure.

Referring to FIG. 1, FIG. 1 is a schematic view of a three dimension memory device according to an embodiment of the disclosure. A three dimension memory device 100 includes a memory cell tile 101, source line switches SLT1 TO SLT16, bit line switches BLT1a to BLT16a, and bit line switches BLT1b to BLT16b. The memory cell tile 101 can be divided into memory cell sub-tiles 110 and 120. The memory cell sub-tile 110 includes multiple memory cells MC1 disposed in a stack, and the memory cell sub-tile 120 includes multiple memory cells MC2 disposed in a stack. In the embodiment, the memory cell tile 101 may be a three-dimensional stacked AND flash memory block or an NOR flash memory block.

In addition, the memory cell sub-tile 110 can be divided into a first part Pa1 and a second part Pa2. Correspondingly, the memory cell sub-tile 120 can be divided into a first part Pb1 and a second part Pb2.

Multiple first terminals of the source line switches SLT1 to SLT16 are commonly coupled to a common source line CSL, and multiple second terminals of the source line switches SLT1 to SLT16 are respectively coupled to multiple source lines of the memory cell sub-tile 110. In addition, the second terminals of the source line switches SLT1 to SLT16 are also respectively coupled to multiple source lines of the memory cell sub-tile 120. That is, the memory cell sub-tiles 110 and 120 can share the source line switches SLT1 to SLT16.

In addition, multiple first terminals of the bit line switches BLT1a to BLT8a are commonly coupled to a global bit line GBL1, and multiple first terminals of the bit line switches BLT9a to BLT16a are commonly coupled to a global bit line GBL2. The bit line switches BLT1a to BLT8a correspond to the first part Pa1 of the memory cell sub-tile 110, and multiple second terminals of the bit-line switches BLT1a to BLT8a are respectively coupled to multiple bit lines of the first part Pa1 of the memory cell sub-tile 110. The bit line switches BLT9a to BLT16a correspond to the second part Pa2 of the memory cell sub-tile 110, and multiple second terminals of the bit-line switches BLT9a to BLT16a are respectively coupled to multiple bit lines of the second part Pa2 of the memory cell sub-tile 110.

In addition, multiple first terminals of the bit line switches BLT1b to BLT8b are commonly coupled to a global bit line BL1, and multiple first terminals of the bit line switches BLT9b to BLT16b are commonly coupled to a global bit line BL2. The bit line switches BLT1b to BLT8b correspond to the first part Pb1 of the memory cell sub-tile 120, and multiple second terminals of the bit line switches BLT1b to BLT8b are respectively coupled to multiple bit lines of the first part Pb1 of the memory cell sub-tile 120. The bit line switches BLT9b to BLT16b correspond to the second part Pb2 of the memory cell sub-tile 120, and multiple second terminals of the bit line switches BLT9b to BLT16b are respectively coupled to multiple bit lines of the second part Pb2 of the memory cell sub-tile 120.

Regarding the positional layout, the first part Pa1 of the memory cell sub-tile 110 and the second part Pb2 of the memory cell sub-tile 120 can be opposite to each other and symmetrical about a reference center, the second part Pa2 of the memory cell sub-tile 110 and the first tile Pb1 of the memory cell sub-tile 120 may be opposite to each other and symmetrical about the reference center.

Regarding the operation details, when the read operation is performed, if a memory cell in the first part Pa1 of the memory cell sub-tile 110 is selected as the selected memory cell for reading, the selected memory cell and the corresponding source line switch and the bit line switch can provide a sensing input terminal of the sense amplifier with a first load. Meanwhile, a reference memory cell can be provided in the second tile Pb2 of the relatively symmetrical memory cell sub-tile 120. The source line switch and the bit line switch corresponding to the reference memory cell can provide a reference input terminal of the sense amplifier with a second load. The source line switch and the bit line switch corresponding to the reference memory cell and the selected memory cell can have the same circuit structure, so the load between the sensing input terminal and the reference input terminal of the sense amplifier can be balanced, so that the accuracy of the generated sensing results can be improved.

In the read operation, when the selected memory cell is located in the second part Pa2 of the memory cell sub-tile 110, the reference memory cell can be located in the first tile Pb1 of the memory cell sub-tile 120; if the selected memory cell is located in the first tile Pb1 of the memory cell sub-tile 120, the reference memory cell can be located in the second part Pa2 of the memory cell sub-tile 110; if the selected memory cell is located in the second tile Pb2 of the memory cell sub-tile 120, the reference memory cell may be located in the first part Pa1 of the memory cell sub-tile 110.

Moreover, in the embodiment, the quantities of the bit line switches BLT1a to BLT16a, the bit line switches BLT1b to BLT16b, and the source line switches SLT1 to SLT16 are not limited. The quantities shown in FIG. 1 are only for the convenience of description and are not intended to limit the scope of the disclosure.

It should be noted here, in present disclosure, the source line switches SLT1 to SLT8 and the source line switches SLT9 to SLT16 may be respectively implemented by same eight switches.

Figure 2A:
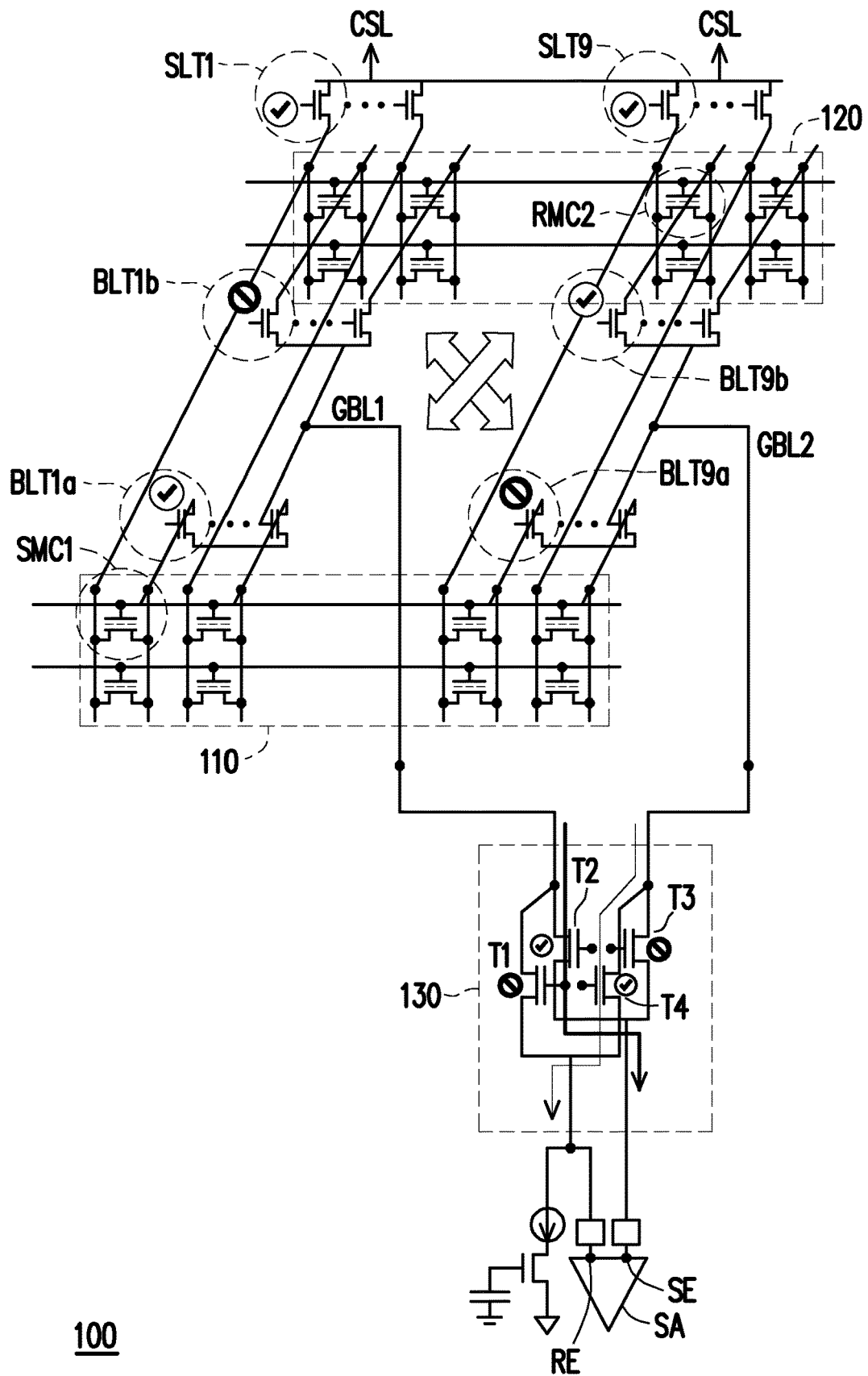
FIG. 2A and FIG. 2B are each schematic views of different implementations of the read operation of the three dimension memory device according to the embodiment of the disclosure.
Figure 2B:
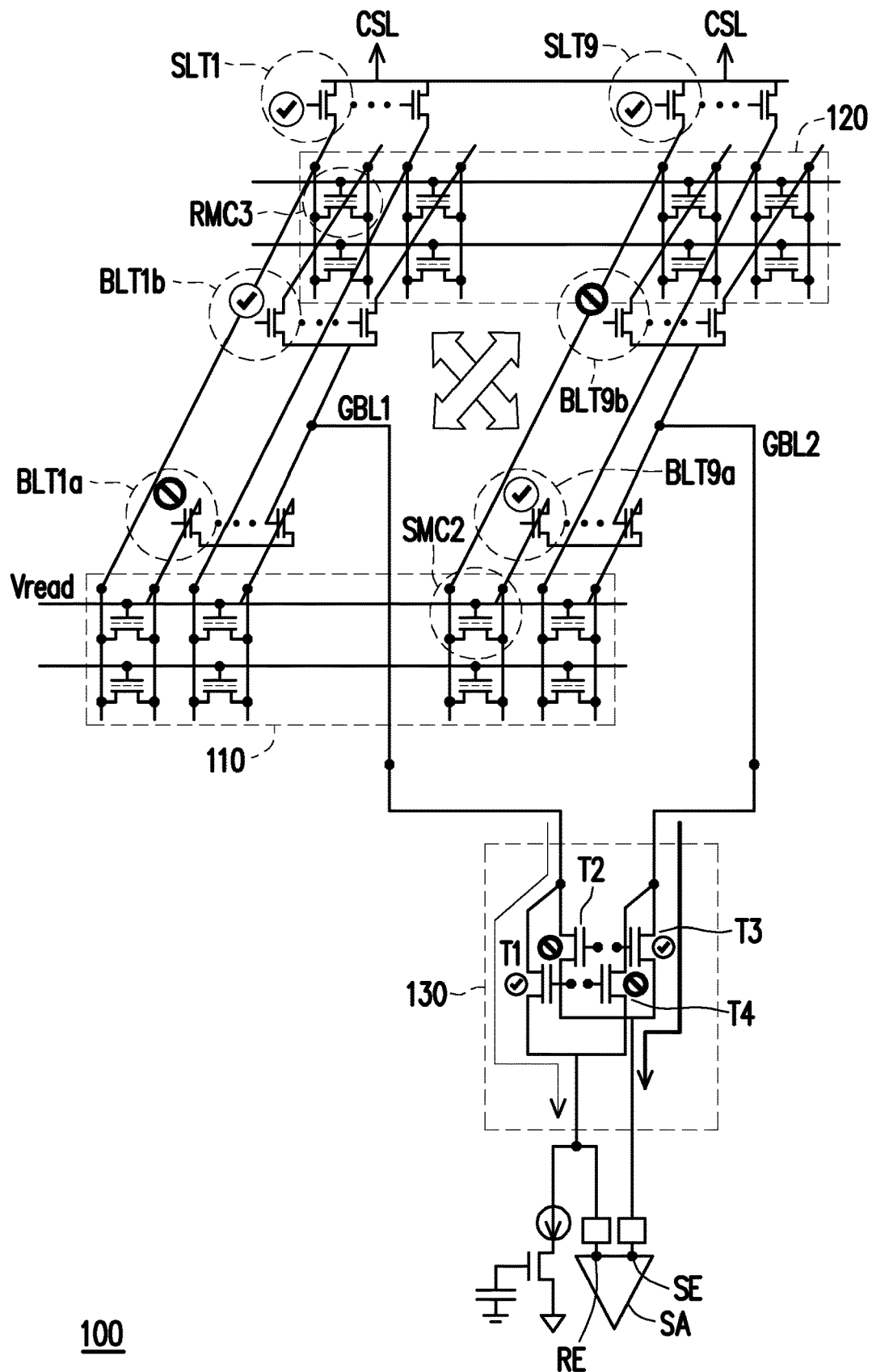

Referring to FIG. 2A and FIG. 2B, FIG. 2A and FIG. 2B are each schematic views of different implementations of the read operation of the three dimension memory device according to the embodiment of the disclosure. The hardware architecture of the three dimension memory device 100 is adopted. In the embodiment, the three dimension memory device 100 further includes a path selector 130 and a sense amplifier SA. The sense amplifier SA has a sensing input terminal SE and a reference input terminal RE. The sensing input terminal SE is configured for receiving a sensed electrical signal, and the reference input terminal RE is configured for receiving a reference signal serving as a sensing standard. The path selector 130 is coupled between the sense amplifier SA and the memory cell sub-tiles 110 and 120. The path selector 130 includes four switches T1-T4 composed of transistors. Moreover, the switch T1 is coupled between the global bit line GBL1 and the reference input terminal RE of the sense amplifier SA; the switch T2 is coupled between the global bit line GBL1 and the sensing input terminal SE of the sense amplifier SA; the switch T3 is coupled between the global bit line GBL2 and the sensing input terminal SE of the sense amplifier SA; the switch T4 is coupled between the global bit line GBL2 and the reference input terminal RE of the sense amplifier SA.

In the embodiment, when a memory cell (a selected memory cell SMC1) in the memory cell sub-tile 110 is selected for the read operation, the position is symmetrical to the selected memory cell SMC1, and one memory cell located in the memory cell sub-tile 120 can serve as a reference memory cell RMC2. In the read operation, both the source line switch SLT1 and the bit line switch BLT1a corresponding to the selected memory cell SMC1 are turned on, and both the source line switch SLT9 and the bit line switch BLT9b corresponding to the reference memory cell RMC2 are also turned on. In addition, the word line corresponding to the selected memory cell SMC1 receives a read voltage Vread and allows the selected memory cell SMC1 to provide a read signal according to the stored data. The word line of the reference memory cell RMC2 receives a reference ground voltage (0 volts), for example, and is in a turned-off state.

In the read operation, the switches T1 and T3 are cut off, and the switches T2 and T4 are turned on. The global bit line GBL1 can be coupled to the sensing input terminal SE of the sense amplifier SA through the switch T2, and the global bit line GBL2 can be coupled to the reference terminal RE of the sense amplifier SA through the switch T4.

Furthermore, in the embodiment, the bit line switches BLT1b and BLT9a are cut off. At the same time, other bit line switches BLT2a to BLT8a, BLT10a to BLT16a, BLT2b to BLT8b and BLT10b to BLT16b are all in a cut-off state.

Figure 2C:
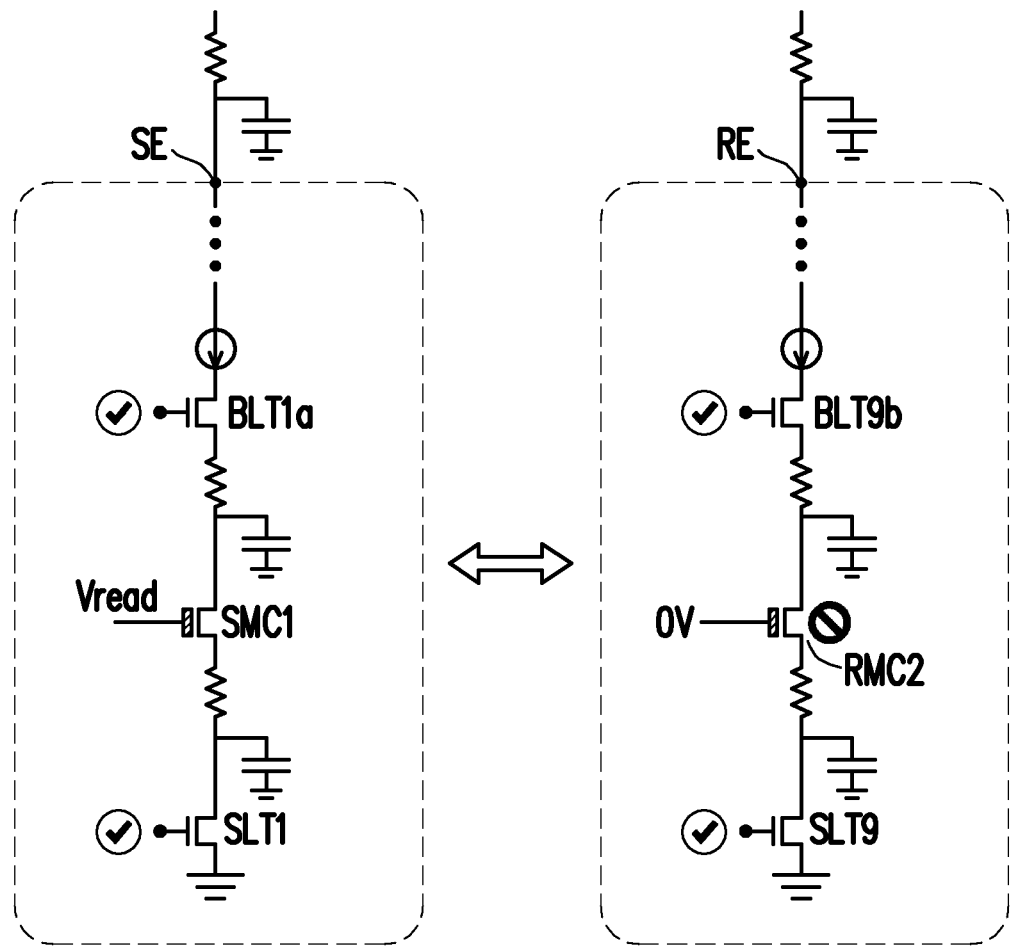
FIG. 2C is a schematic view illustrating load states of two input terminals in a read operation of a sense amplifier of the three dimension memory device according to the embodiment of the disclosure.

Referring to FIG. 2C, FIG. 2C is a schematic view illustrating load states of two input terminals in a read operation of a sense amplifier of the three dimension memory device according to the embodiment of the disclosure. Under the premise that the bit line switches BLT1a and BLT9b and the source line switches SLT1 and SLT9 are the same circuit elements, the load difference between the sensing input terminal SE of the sense amplifier SA and the reference input terminal RE is only related to the data storage state of the selected memory cell SMC1. Therefore, the sense amplifier SA can sense accurate sensing results according to the signals on the sensing input terminal SE and the reference input terminal RE.

Referring to FIG. 2B, in the embodiment, when another part of the memory cell (the selected memory cell SMC2) in the memory cell sub-tile 110 is selected for the read operation, the position is symmetrical to the selected memory cell SMC2, and the memory cell located in the memory cell sub-tile 120 can serve as a reference memory cell RMC3. In the read operation, both the source line switch SLT9 and the bit line switch BLT9a corresponding to the selected memory cell SMC2 are turned on, and both the source line switch SLT1 and the bit line switch BLT1b corresponding to the reference memory cell RMC3 are also turned on. In addition, the word line corresponding to the selected memory cell SMC2 receives the read voltage Vread and allows the selected memory cell SMC2 to provide a read signal according to the stored data. The word line of the reference memory cell RMC3 receives the reference ground voltage (0 volts), for example, and is in a turned-off state.

In the read operation, the switches T2 and T4 are cut off, and the switches T1 and T3 are turned on. The global bit line GBL1 can be coupled to the reference terminal RE of the sense amplifier SA through the switch T1, and the global bit line GBL2 can be coupled to the sensing terminal SE of the sense amplifier SA through the switch T3.

Furthermore, in the embodiment, the bit line switches BLT9b and BLT1a are cut off. At the same time, other bit line switches BLT2a to BLT8a, BLT10a to BLT16a, BLT2b to BLT8b and BLT10b to BLT16b are all in a cut-off state.

Figure 3:
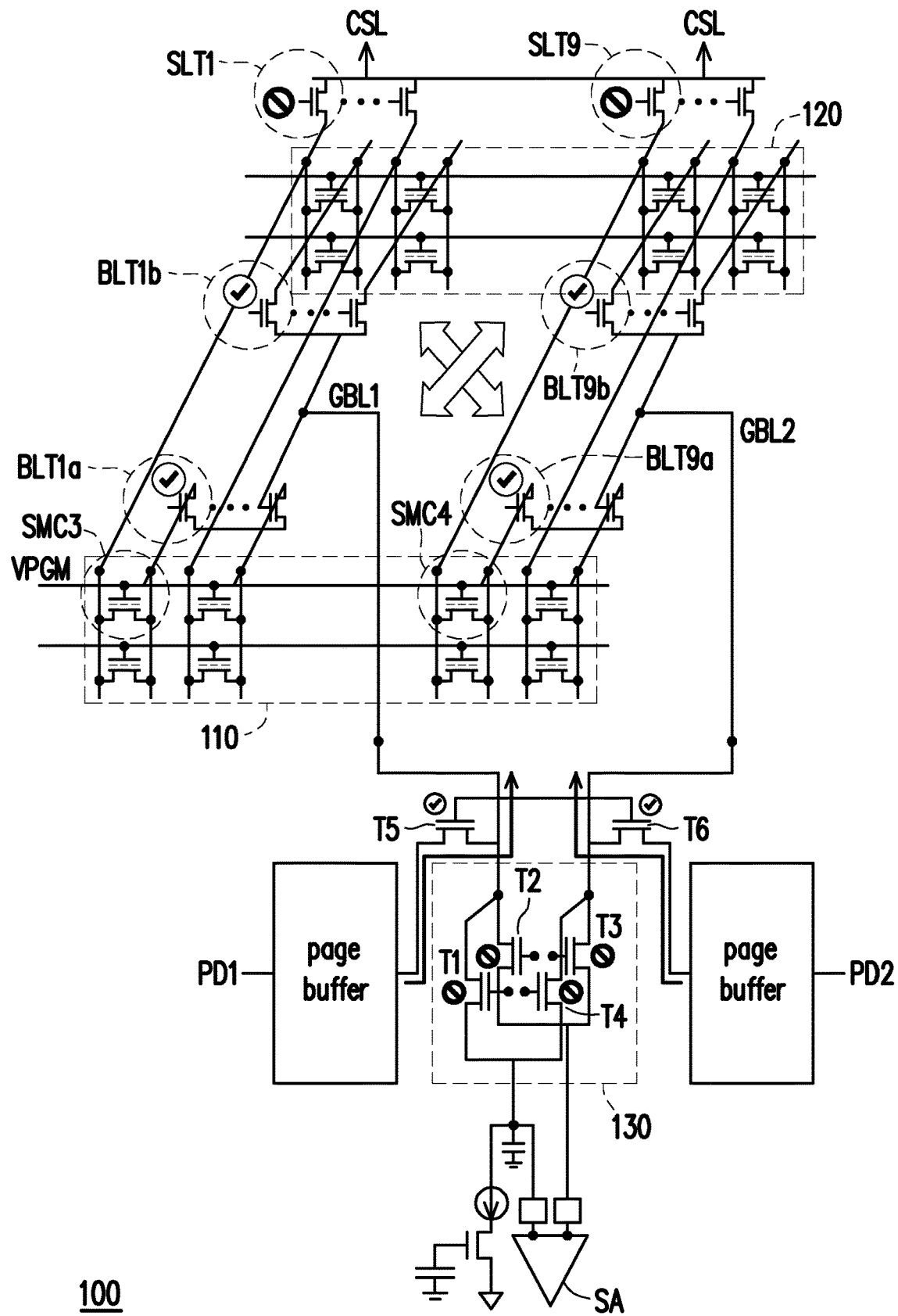
FIG. 3 is a schematic view illustrating a programming operation of a three dimension memory device according to an embodiment of the disclosure.

In the subsequent paragraphs, referring to FIG. 3, FIG. 3 is a schematic view illustrating a programming operation of a three dimension memory device according to an embodiment of the disclosure. The hardware architecture of the three dimension memory device 100 is adopted. The three dimension memory device 100 further includes page buffers 141 and 142 and switches T5 and T6. The page buffers 141 and 142 are respectively connected to the global bit lines GBL1 and GBL2 through the switches T5 and T6 composed of transistors.

When the programming operation is performed, the switches T1-T4 in the path selector 130 are all cut off, so that the global bit lines GBL1 and GBL2 and the sense amplifier SA are electrically isolated from one another. The switches T5 and T6 are turned on, so that data PD1 and PD2 respectively received by the page buffers 141 and 142 are transmitted to the global bit lines GBL1 and GBL2 respectively. Furthermore, when the three dimension memory device 100 performs the read operation, the switches T5 and T6 can be cut off.

In addition, if two parts of the memory cells (the selected memory cells SMC3 and SMC4) in the memory cell sub-tile 110 are selected to perform the programming operation, both the bit line switch BLT1a corresponding to the selected memory cell SMC3 and the bit line switch BLT9a corresponding to the selected memory cell SMC4 are turned on. Meanwhile, the source line switches SLT1 and SLT9 are cut off, and the corresponding bit line switches BLT1b and BLT9b can also be turned on.

Meanwhile, the word line (the same word line) of the selected memory cells SMC3 and SMC4 can receive a programming voltage VPGM and allow the selected memory cells SMC3 and SMC4 to perform the programming operation according to the data PD1 and PD2 on the global bit lines GBL1 and GBL2.

In addition, to prevent the unselected memory cells from being disturbed by the programming operation, the word lines to which the remaining memory cells other than the selected memory cells SMC3 and SMC4 are coupled can receive the reference ground voltage (e.g., 0 volts).

In the embodiment, the circuit structures of the page buffers 141 and 142 can be implemented by using a page buffer circuit well known to those skilled in the art in the memory field, which is not limited in the disclosure.

In the programming operation of the embodiment, multiple selected memory cells can be written at one time, which is one of the implementations of page programming.

Figure 4:
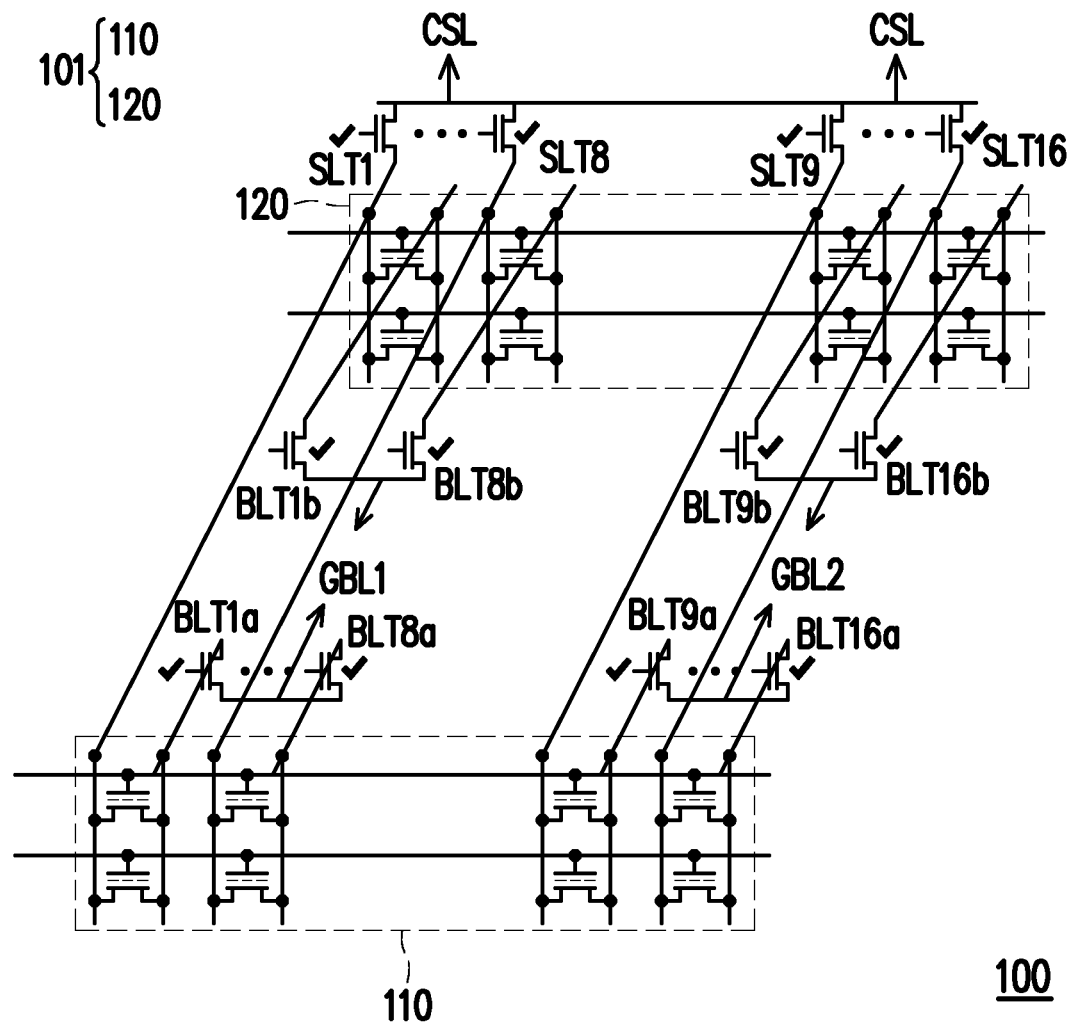
FIG. 4 is a schematic view illustrating an erase operation of a three dimension memory device according to an embodiment of the disclosure.

In the subsequent paragraphs, referring to FIG. 4, FIG. 4 is a schematic view illustrating an erase operation of a three dimension memory device according to an embodiment of the disclosure. The hardware architecture of the three dimension memory device 100 is adopted as well. In the embodiment, the erase operation is a tile erase operation. When the erase operation is performed, the bit line switches BLT1a to BLT16a and the bit line switches BLT1b to BLT16b are all turned on, the source line switches SLT1 to SLT16 are also turned on, and voltages with 4 volts to 6 volts are provided to bit lines and source lines of all the memory cells. In the example in which the memory cell sub-tile 110 is the selected tile (the memory cell sub-tile 120 is not erased) for performing the erase operation, the word lines of the memory cell sub-tile 110 may each receive an erase voltage (e.g., −6 volts to −8 volts), and the word lines of the memory cell sub-tile 120 may each receive an erase mask voltage (e.g., 4.5 volts).

It should be noted here, in present disclosure, the source line switches SLT1 to SLT8 and the source line switches SLT9 to SLT16 may be respectively implemented by same eight switches.

Note that according to the embodiments illustrated in FIG. 1 to FIG. 4, in the three dimension memory device 100 of the disclosure, the on and off states of the bit line switches BLT1b to BLT8b and the bit line switches BLT9a to BLT16a are the same respectively in any operation mode. The on and off states of the bit line switches BLT1a to BLT8a and the bit line switches BLT9b to BLT16b are the same respectively in any operation mode. That is, the bit line switches BLT1b to BLT8b and the bit line switches BLT9a to BLT16a can share the same eight driving signals, and the bit line switches BLT1a to BLT8a and the bit line switches BLT9b to BLT16b can also share other eight driving signals. Accordingly, in the three dimension memory device 100 according to the embodiment of the disclosure, the quantity of the driving signals for controlling the bit line switches BLT1a to BLT16b can be decreased by half, thereby effectively reducing the layout area of the circuit.

Figure 5:
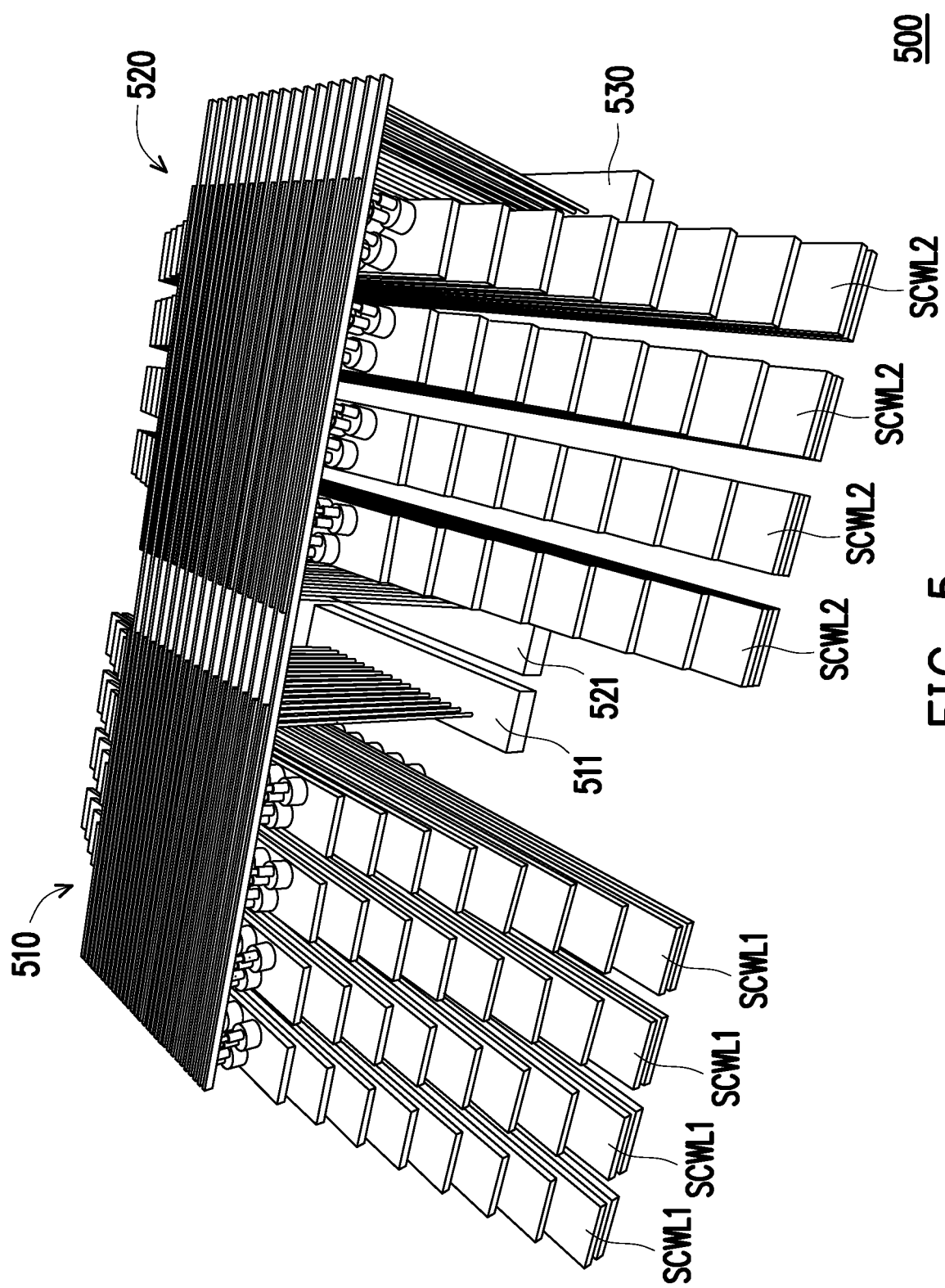
FIG. 5 is a three-dimensional structure view of a three dimension memory device according to an embodiment of the disclosure.

In the subsequent paragraphs, referring to FIG. 5, FIG. 5 is a three-dimensional structure view of a three dimension memory device according to an embodiment of the disclosure. A three dimension memory device 500 includes memory cell sub-tiles 510 and 520. The memory cell sub-tile 510 includes multiple word line structures SCWL1 stacked in a staircase shape, and the memory cell sub-tile 520 includes multiple word line structures SCWL2 stacked in a staircase shape. Layout areas 511 and 521 are disposed between the memory cell sub-tiles 510 and 520 for configuring bit line switches. The layout areas 511 and 521 are disposed between the memory cell sub-tiles 510 and 520 in sequence. In addition, a layout area 530 with source line switches is disposed on a side of the memory cell sub-tile 520 not adjacent to the layout areas 511 and 521. The layout areas 511 and 521 are configured for disposing multiple bit line switches corresponding to the memory cell sub-tiles 510 and 520 respectively, and the layout area 530 is configured for disposing multiple source line switches shared by the memory cell sub-tiles 510 and 520.

Figure 6:
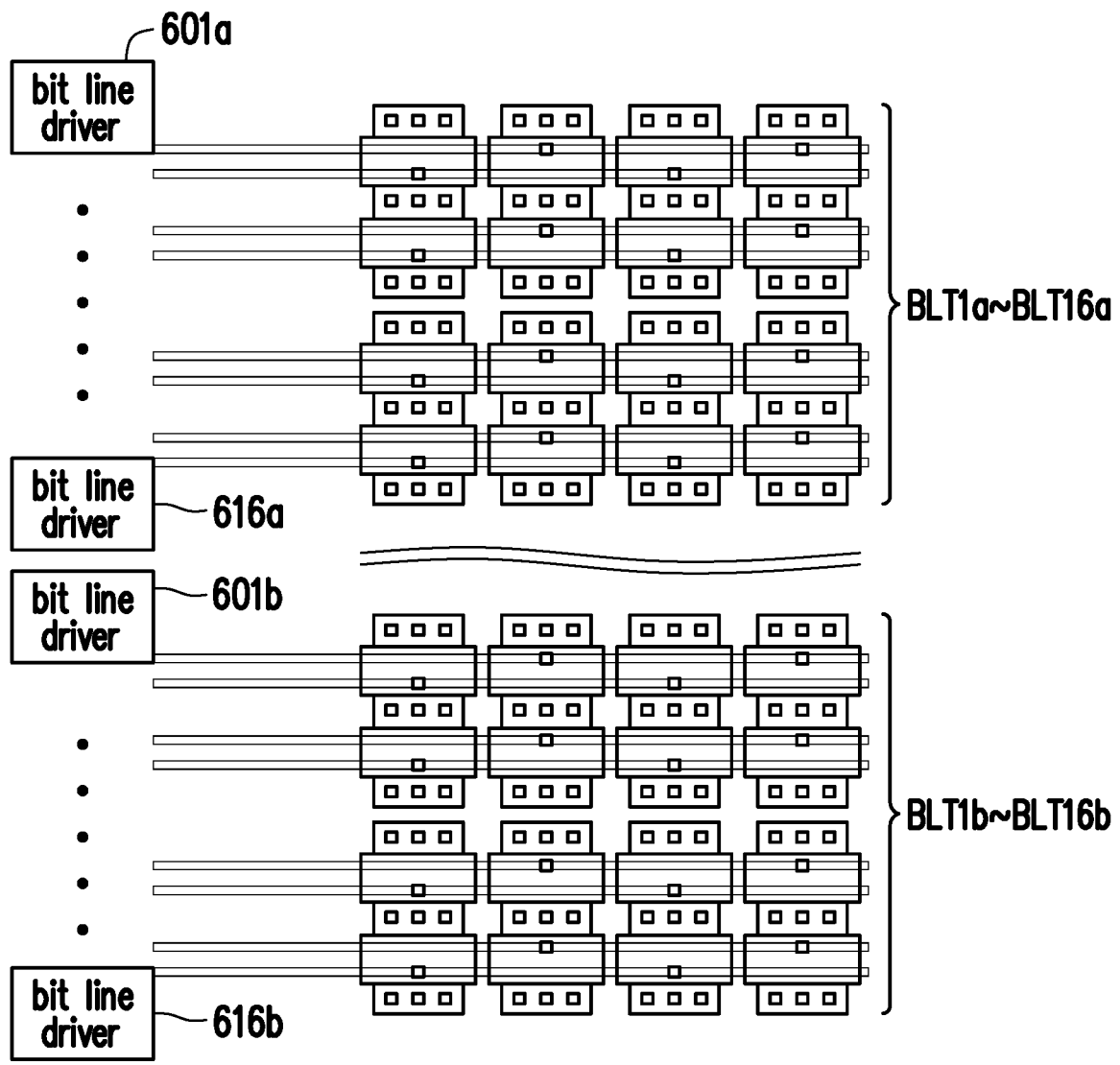
FIG. 6 is a schematic view illustrating an implementation of a word line switch of a three dimension memory device according to an embodiment of the disclosure.

In the subsequent paragraphs, referring to FIG. 6, FIG. 6 is a schematic view illustrating an implementation of a word line switch of a three dimension memory device according to an embodiment of the disclosure. In the embodiment, each memory cell sub-tile having 16 bit lines is illustrated as an example. The three dimension memory device has multiple bit line switches BLT1a to BLT16a corresponding to the first memory cell sub-tile and multiple bit line switches BLT1b to BLT16b corresponding to the first memory cell sub-tile. The bit line switches BLT1a to BLT16a are arranged in an array and respectively coupled to the 16 bit line drivers 601*a* to 616*a*. The bit line switches BLT1*b* to BLT16*b* are arranged in an array and respectively coupled to the 16 bit line drivers 601*b* to 616*b*.

The bit line drivers 601*a* to 616*a* and the bit line drivers 601*b* to 616*b* correspond to the bit line switches BLT1*a* to BLT16*a* and the bit line switches BLT1*b* to BLT16*b* one-to-one, respectively, and the on and off states of the bit line switches BLT1*a* to BLT16*a* and the bit line switches BLT1*b* to BLT16*b* are controlled by the generated driving signal.

Figure 7:
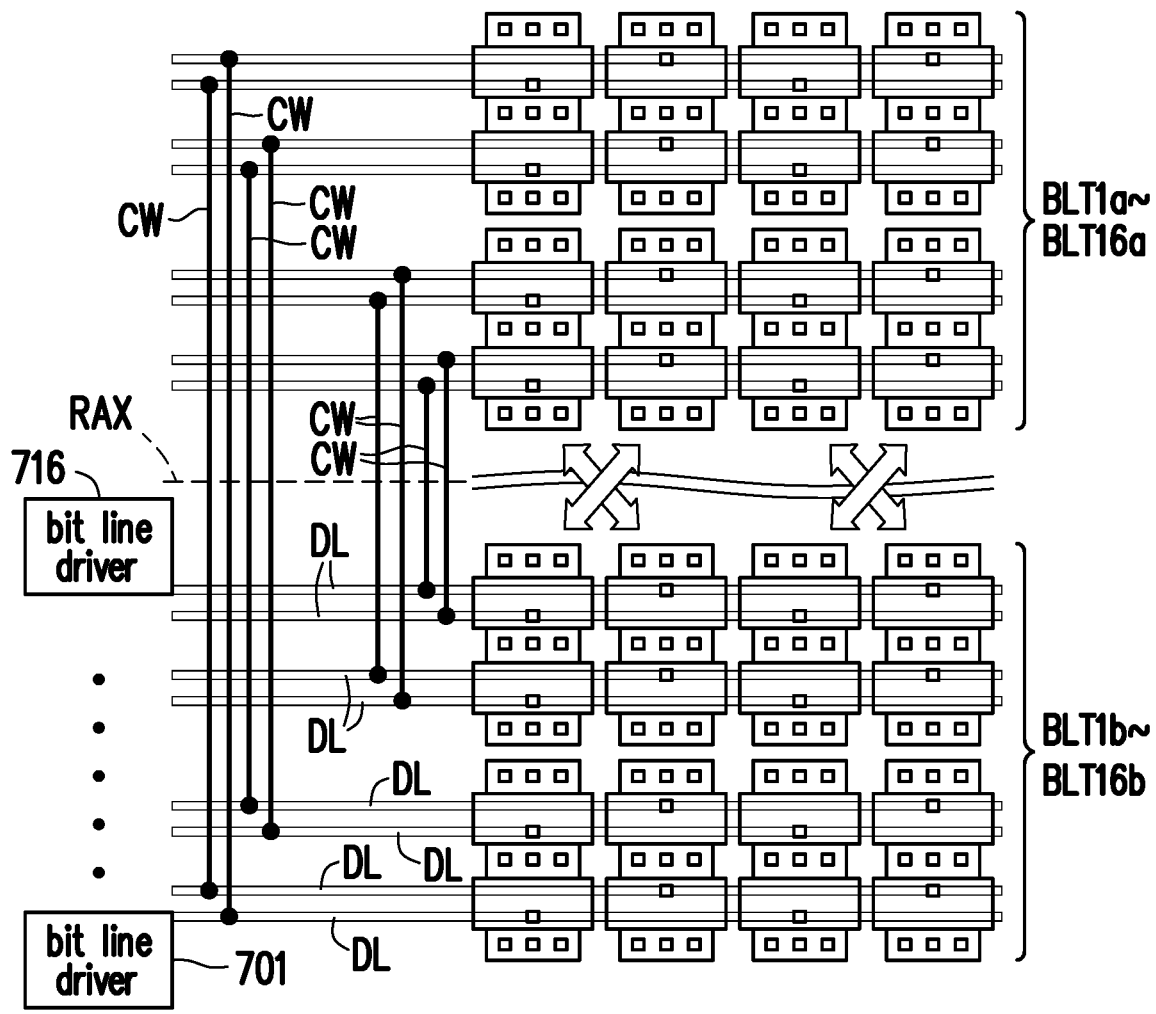
FIG. 7 is a schematic view illustrating another implementation of the word line switch of the three dimension memory device according to the embodiment of the disclosure.

In the subsequent paragraphs, referring to FIG. 7, FIG. 7 is a schematic view illustrating another implementation of the word line switch of the three dimension memory device according to the embodiment of the disclosure. According to the foregoing implementation, in the three dimension memory device of the disclosure, the on and off states of the bit line switches have correspondence. That is, in the three dimension memory device of the embodiment of the disclosure, the on and off states of the bit line switches in the first part of the first sub-memory cells are the same as the on and off states of the bit-line switches in the second part of the second sub-memory cells. The on and off states of the bit line switches in the second part of the first sub-memory cells are the same as the on and off states of the bit line switches in the first part of the second sub-memory cells. Therefore, by adjusting the layout positions of the bit line switches BLT1*a* to BLT16*a* and the bit line switches BLT1*b* to BLT16*b*, driving lines DL corresponding to the symmetrical bit line switches are disposed symmetrically with respect to a reference axis RAX.

In addition, the three dimension memory device of the embodiment of the disclosure also has multiple bridge lines CW. The bridge line CW is configured for connecting the two driving lines DL symmetrical to the reference axis RAX to each other and for transmitting the same driving signal.

With such a configuration, the quantity of the bit line drivers 701 to 716 can be decreased by half, which effectively saves the area required for the circuit layout and the power consumption of the three dimension memory device.

In summary, in the three dimension memory device of the disclosure, the memory cell tile is divided into two memory cell sub-tiles. In addition, when the read operation is performed, relatively symmetrical selected memory cells and reference memory cells are coupled to the sense amplifier, so that the loads of the reference input terminal and the sensing input terminal of the sense amplifier can be balanced to improve the accuracy of sensing results.

What is claimed is:

1. A three dimension memory device, comprising:
   a memory cell tile divided into a first memory cell sub-tile and a second memory cell sub-tile, wherein the first memory cell sub-tile comprises a plurality of first memory cells, and the second memory cell sub-tile comprises a plurality of second memory cells;
   a plurality of source line switches commonly coupled to a common source line and respectively coupled to a plurality of first source lines of the first memory cell sub-tile and a plurality of second source lines of the second memory cell sub-tile;
   a plurality of first bit line switches commonly coupled to a first global bit line and respectively coupled to a plurality of first bit lines in a first part of the first memory cell sub-tile;
   a plurality of second bit line switches commonly coupled to a second global bit line and respectively coupled to a plurality of second bit lines in a second part of the first memory cell sub-tile;
   a plurality of third bit line switches commonly coupled to the first global bit line and respectively coupled to a plurality of third bit lines in a first part of the second memory cell sub-tile; and
   a plurality of fourth bit line switches commonly coupled to the second global bit line and respectively coupled to a plurality of fourth bit lines in a second part of the second memory cell sub-tile,
   wherein in a read operation, a first selected bit line switch and a first source line switch corresponding to a selected memory cell in the plurality of the first memory cells are turned on, and a second selected bit line switch and a second source line switch corresponding to a reference memory cell in the plurality of the second memory cells are turned on.

2. The three dimension memory device according to claim 1, wherein a control terminal of the selected memory cell receives a read voltage through a first word line, and a control terminal of the reference memory cell receives a reference ground voltage through a second word line.

3. The three dimension memory device according to claim 1, further comprising:
   a path selector coupled to the first global bit line and the second global bit line;
   a sense amplifier coupled to the path selector and comprising a sensing input terminal and a reference input terminal, wherein the sense amplifier compares signals on the sensing input terminal and signals on the reference input terminal to generate a sensing result.

4. The three dimension memory device according to claim 3, wherein in a read operation of the path selector, the first global bit line is coupled to one of the sensing input terminal and the reference input terminal, and the second global bit line is coupled to the other of the sensing input terminal and the reference input terminal.

5. The three dimension memory device according to claim 3, wherein the path selector comprises:
   a first switch coupled between the first global bit line and the reference input terminal of the sense amplifier;
   a second switch coupled between the first global bit line and the sensing input terminal of the sense amplifier;
   a third switch coupled between the second global bit line and the sensing input terminal of the sense amplifier; and
   a fourth switch coupled between the second global bit line and the reference input terminal of the sense amplifier.

6. The three dimension memory device according to claim 5, wherein in a read operation, on and off states of the first switch and on and off states of the second switch are opposite, on and off states of the third switch and on and off states of the fourth switch are opposite, and the on and off states of the first switch and the on and off states of the fourth switch are opposite.

7. The three dimension memory device according to claim 1, further comprising:
   a first switch;
   a second switch;
   a first page buffer coupled to the first global bit line through the first switch; and
   a second page buffer coupled to the first global bit line through the first switch.

8. The three dimension memory device according to claim 7, wherein the first switch and the second switch are cut off in a read operation.

9. The three dimension memory device according to claim 7, wherein in a programming operation, a first selected bit line switch corresponding to a first selected memory cell in a first part of the plurality of the first memory cells is turned on, a first source line switch corresponding to the first selected memory cell is cut off, and the first page buffer provides first data to be written to the first selected memory cell.

10. The three dimension memory device according to claim 9, wherein in the programming operation, a second selected bit line switch corresponding to a second selected memory cell in a second part of the plurality of the second memory cells is turned on, a second source line switch corresponding to the second selected memory cell is cut off, and the second page buffer provides second data to be written to the second selected memory cell.

11. The three dimension memory device according to claim 7, wherein in a tile erase operation, the plurality of the first bit line switches, the plurality of the second bit line switches, the plurality of the third bit line switches, the plurality of the fourth bit line switches, and the plurality of the source line switches are turned on, a plurality of first word lines of the plurality of the first memory cells receive an erase voltage to be erased, and a plurality of second word lines of the plurality of the second memory cells receive an erase mask voltage to prevent from being erased.

12. The three dimension memory device according to claim 1, wherein the plurality of the first bit line switches, the plurality of the second bit line switches, the plurality of the third bit line switches, and the plurality of the fourth bit line switches are disposed between the first memory cell sub-tile and the second memory cell sub-tile.

13. The three dimension memory device according to claim 12, wherein the plurality of the source line switches are disposed on a side of the second memory cell sub-tile not adjacent to the plurality of the third bit line switches and the plurality of the fourth bit line switches.

14. The three dimension memory device according to claim 1, further comprising:
a plurality of first bit line drivers respectively transmitting a plurality of first driving signals to the plurality of the first bit line switches and the plurality of the second bit line switches through a plurality of first driving lines; and
a plurality of second bit line drivers respectively transmitting a plurality of second driving signals to the plurality of the third bit line switches and the plurality of the fourth bit line switches through a plurality of second driving lines.

15. The three dimension memory device according to claim 1, further comprising:
a plurality of first driving lines for respectively transmitting a plurality of driving signals to the plurality of the first bit line switches and the plurality of the second bit line switches;
a plurality of second driving lines for respectively transmitting the plurality of the driving signals to the plurality of the third bit line switches and the plurality of the fourth bit line switches; and
a plurality of bridge lines, wherein each of the plurality of the bridge lines is coupled between each of the plurality of the first driving lines and each of the corresponding second driving lines.

16. The three dimension memory device according to claim 15, further comprising:
a plurality of bit line drivers coupled to the plurality of the first driving lines or the plurality of the second driving lines for generating the plurality of the driving signals.

17. The three dimension memory device according to claim 16, a quantity of the plurality of the driving signals is half of a sum of the plurality of the first bit line switches, the plurality of the second bit line switches, the plurality of the third bit line switches, and the plurality of the fourth bit line switches.

18. The three dimension memory device according to claim 16, wherein the plurality of the first bit line switches, the plurality of the second bit line switches, the plurality of the third bit line switches, and the plurality of the fourth bit line switches are arranged in an array.

19. The three dimension memory device according to claim 15, wherein a position of each of the first driving lines and a position of each of the corresponding second driving lines are symmetrical about a reference axis.

20. A three dimension memory device, comprising:
a memory cell tile divided into a first memory cell sub-tile and a second memory cell sub-tile, wherein the first memory cell sub-tile comprises a plurality of first memory cells, and the second memory cell sub-tile comprises a plurality of second memory cells;
a plurality of source line switches commonly coupled to a common source line and respectively coupled to a plurality of first source lines of the first memory cell sub-tile and a plurality of second source lines of the second memory cell sub-tile;
a plurality of first bit line switches commonly coupled to a first global bit line and respectively coupled to a plurality of first bit lines in a first part of the first memory cell sub-tile;
a plurality of second bit line switches commonly coupled to a second global bit line and respectively coupled to a plurality of second bit lines in a second part of the first memory cell sub-tile;
a plurality of third bit line switches commonly coupled to the first global bit line and respectively coupled to a plurality of third bit lines in a first part of the second memory cell sub-tile;
a plurality of fourth bit line switches commonly coupled to the second global bit line and respectively coupled to a plurality of fourth bit lines in a second part of the second memory cell sub-tile;
a path selector coupled to the first global bit line and the second global bit line; and
a sense amplifier coupled to the path selector and comprising a sensing input terminal and a reference input terminal, wherein the sense amplifier compares signals on the sensing input terminal and signals on the reference input terminal to generate a sensing result.

21. A three dimension memory device, comprising:
a memory cell tile divided into a first memory cell sub-tile and a second memory cell sub-tile, wherein the first memory cell sub-tile comprises a plurality of first memory cells, and the second memory cell sub-tile comprises a plurality of second memory cells;
a plurality of source line switches commonly coupled to a common source line and respectively coupled to a plurality of first source lines of the first memory cell sub-tile and a plurality of second source lines of the second memory cell sub-tile;
a plurality of first bit line switches commonly coupled to a first global bit line and respectively coupled to a plurality of first bit lines in a first part of the first memory cell sub-tile;
a plurality of second bit line switches commonly coupled to a second global bit line and respectively coupled to a plurality of second bit lines in a second part of the first memory cell sub-tile;

a plurality of third bit line switches commonly coupled to the first global bit line and respectively coupled to a plurality of third bit lines in a first part of the second memory cell sub-tile;

a plurality of fourth bit line switches commonly coupled to the second global bit line and respectively coupled to a plurality of fourth bit lines in a second part of the second memory cell sub-tile;

a plurality of first bit line drivers respectively transmitting a plurality of first driving signals to the plurality of the first bit line switches and the plurality of the second bit line switches through a plurality of first driving lines; and a plurality of second bit line drivers respectively transmitting a plurality of second driving signals to the plurality of the third bit line switches and the plurality of the fourth bit line switches through a plurality of second driving lines.

* * * * *